(12) United States Patent
Callanan

(10) Patent No.: US 8,847,563 B2
(45) Date of Patent: Sep. 30, 2014

(54) POWER CONVERTER CIRCUITS INCLUDING HIGH ELECTRON MOBILITY TRANSISTORS FOR SWITCHING AND RECTIFCATION

(75) Inventor: Robert Joseph Callanan, Raleigh, NC (US)

(73) Assignee: Cree, Inc., Durham, NC (US)

( * ) Notice: Subject to any disclaimer, the term of this patent is extended or adjusted under 35 U.S.C. 154(b) by 376 days.

(21) Appl. No.: 12/837,092

(22) Filed: Jul. 15, 2010

(65) Prior Publication Data

US 2012/0074920 A1 Mar. 29, 2012

(51) Int. Cl.
*H02M 3/156* (2006.01)
*H03K 17/74* (2006.01)
*H03K 17/567* (2006.01)
*H02M 3/158* (2006.01)

(52) U.S. Cl.
CPC ............. *H03K 17/567* (2013.01); *H03K 17/74* (2013.01)
USPC ......................................... 323/222; 323/225

(58) Field of Classification Search
USPC ............... 323/282, 284, 222–224, 84, 89, 74, 323/78–81, 225; 257/192; 363/84, 89, 74, 363/78–81
See application file for complete search history.

(56) References Cited

U.S. PATENT DOCUMENTS

| | | | |
|---|---|---|---|
| 5,192,987 A | 3/1993 | Khan et al. | |
| 5,296,395 A | 3/1994 | Khan et al. | |
| 6,151,222 A | 11/2000 | Barrett | |
| 6,316,793 B1 | 11/2001 | Sheppard et al. | |
| 6,452,365 B1 | 9/2002 | Majumdar et al. | |
| 6,930,893 B2 * | 8/2005 | Vinciarelli | 363/17 |
| 7,038,435 B2 * | 5/2006 | Ortiz et al. | 323/282 |
| 7,599,196 B2 | 10/2009 | Alexander | |
| 7,742,318 B2 | 6/2010 | Fu et al. | |
| 7,781,987 B2 * | 8/2010 | Cheng et al. | 315/307 |
| 7,839,131 B2 * | 11/2010 | Yang et al. | 323/282 |
| 8,054,110 B2 * | 11/2011 | Wang et al. | 327/109 |
| 8,084,783 B2 * | 12/2011 | Zhang | 257/133 |
| 2005/0170574 A1 | 8/2005 | Sheppard et al. | |
| 2006/0012348 A1 * | 1/2006 | Zhao et al. | 323/259 |
| 2006/0175633 A1 * | 8/2006 | Kinzer | 257/192 |
| 2008/0084197 A1 | 4/2008 | Williams et al. | |
| 2009/0278513 A1 * | 11/2009 | Bahramian et al. | 323/217 |
| 2010/0019279 A1 | 1/2010 | Chen et al. | |
| 2010/0060362 A1 * | 3/2010 | Kanaya et al. | 330/306 |
| 2010/0117095 A1 | 5/2010 | Zhang | |

OTHER PUBLICATIONS

Yifeng Wu, A 98.8% Efficient GaN HEMT Boost Coverter With 300-W Output Power at 1 Mhz, Aug. 2008, IWW Electron Device Letters, vol. 29, pp. 824-826.*
Yifeng et al., A 97.8% Efficient GaN HEMT Boost Converter With 300-W Output Power at 1 MHz, Aug. 2008, IEEE, vol. 29 No. 8, pp. 824-826.*
Sami Ajram, Ultrahigh frequency DC-to-DC converters using GaAs power switches, Sep. 2001, IEEE, vol. 16. No. 5, pp. 594-602.*

(Continued)

*Primary Examiner* — Gary L Laxton
(74) *Attorney, Agent, or Firm* — Myers Bigel Sibley & Sajovec, P.A.

(57) ABSTRACT

A power converter circuit includes a storage component, a rectifier component comprising a first field effect transistor and having first and second bias states, and a switch including a second field effect transistor having first and second operational states. The first and second field effect transistors are High Electron Mobility Transistors (HEMTs).

13 Claims, 2 Drawing Sheets

(56) References Cited

OTHER PUBLICATIONS

International Search Report Corresponding to International Application No. PCT/US2011/043813; Date of Mailing: Nov. 22, 2011; 15 pages.
U.S. Appl. No. 12/506,610, Callanan et al.

International Preliminary Report on Patentability and Written Opinion Corresponding to International Application No. PCT/US2011/043813; Date of Mailing: Jan. 24, 2013; 7 Pages.

Japanese Office Action Corresponding to Japanese Patent Application No. 2013-519788; Date Mailed: Mar. 12, 2014; Foreign Text, 3 Pages, English Translation Thereof, 3 Pages.

* cited by examiner

| Parameter | Value |
|---|---|
| Frequency | 20 MHz |
| Duty Cycle (Vctrl) | ~50% |
| Input Voltage (Vin) | 175 VDC |
| Input Power | 184.5 W |
| Output Voltage (Vout) | 350 VDC |
| Output Power | 175 W |
| Efficiency | 94.9% |
| J2 Power Loss | 1.3 W |
| J1 Power Loss | 8.1 W |

POWER CONVERTER CIRCUITS INCLUDING HIGH ELECTRON MOBILITY TRANSISTORS FOR SWITCHING AND RECTIFCATION

STATEMENT OF U.S. GOVERNMENT INTEREST

This invention was made with Government support under Office of Naval Research Contract No. 05-C-0226. The Government has certain rights in the invention.

FIELD OF THE INVENTION

The present invention relates to power conversion and, more particularly, to power converter circuits that operate at relatively high frequencies and relatively high voltages.

BACKGROUND

Power converter circuits may be used to convey power from a source, such as a battery, power supply, electrical power grid, etc. to a load, such as any device, apparatus, or component that runs on electricity preferably with as little loss as possible. Generally, a power converter circuit provides an output voltage that has a different level than the input voltage. One type of power converter circuit is a Direct Current to Direct Current (DC to DC) circuit. DC to DC power converters typically operate by temporarily storing input energy from a power source and then releasing that energy to an output load at a different voltage level. Switched mode DC to DC converter circuits are generally more power efficient than linear voltage regulators, which dissipate unwanted power as heat. It is generally desirable to operate switched mode power converter circuits at higher frequencies as the component size and weight of such circuits can be reduced by, for example, eliminating low frequency transformers.

SUMMARY

In some embodiments of the present inventive subject matter, a power converter circuit includes a storage component, a rectifier component comprising a first field effect transistor and having first and second bias states, and a switch including a second field effect transistor having first and second operational states. The first and second field effect transistors are High Electron Mobility Transistors (HEMTs).

In other embodiments, energy from a power source is stored in the storage component when the switch is configured in the first operational state and the rectifier component is in the first bias state and the stored energy in the storage component is released to a load when the switch is configured in the second operational state and the rectifier component is in the second bias state.

In still other embodiments, the rectifier component further includes a semiconductor diode having a cathode connected to a source node of the first field effect transistor and an anode connected to a gate node of the first field effect transistor.

In still other embodiments, the semiconductor diode is a hot carrier diode.

In still other embodiments, the semiconductor diode includes a Schottky diode.

In still other embodiments, the semiconductor diode comprises a silicon Schottky diode.

In still other embodiments, the first HEMT includes at least one heterojunction as a conducting channel.

In still other embodiments, the second HEMT includes at least one heterojunction as a conducting channel.

In still other embodiments, the power converter circuit is a Direct Current to Direct Current (DC to DC) power converter circuit and the switch is operable in a hard switched mode.

In still other embodiments, the power converter circuit is a Direct Current to Direct Current (DC to DC) power converter and the switch is operable in a resonant switched mode.

In still other embodiments, the power converter circuit is a Direct Current to Direct Current (DC to DC) power converter circuit and the storage component, the rectifier, and the switch are configured in a Buck configuration, a Boost configuration, a Buck-Boost configuration, a Cuk configuration, a Single Ended Primary Inductor Converter (SEPIC) configuration, or a Zeta configuration.

In still other embodiments, the storage component includes a magnetic field storage component.

In still other embodiments, the magnetic field storage component includes an inductor and/or a transformer.

In still other embodiments, the storage component comprises an electric field storage component.

In still other embodiments, the electric field storage component includes a capacitor.

In still other embodiments, the first and second HEMTs comprise first and second GaN HEMTs.

In further embodiments of the present inventive subject matter, a power converter circuit has a switching frequency in a range of about 10 MHz-100 MHz when operating in a resonance switched operational mode and having an efficiency of at least about 95%.

In still further embodiments, the power converter circuit operates at voltages up to about 600 V.

In other embodiments of the present inventive subject matter, a power converter circuit has a switching frequency in a range of about 1 MHz-10 MHz when operating in a hard switched operational mode and having an efficiency of at least about 95%.

In still other embodiments, the power converter circuit operates at voltages up to about 600 V.

Other power converter circuits according to embodiments of the inventive subject matter will be or become apparent to one with skill in the art upon review of the following drawings and detailed description. It is intended that all such additional power converter circuits be included within this description, be within the scope of the present inventive subject matter, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the inventive subject matter.

DETAILED DESCRIPTION

Figure 1:
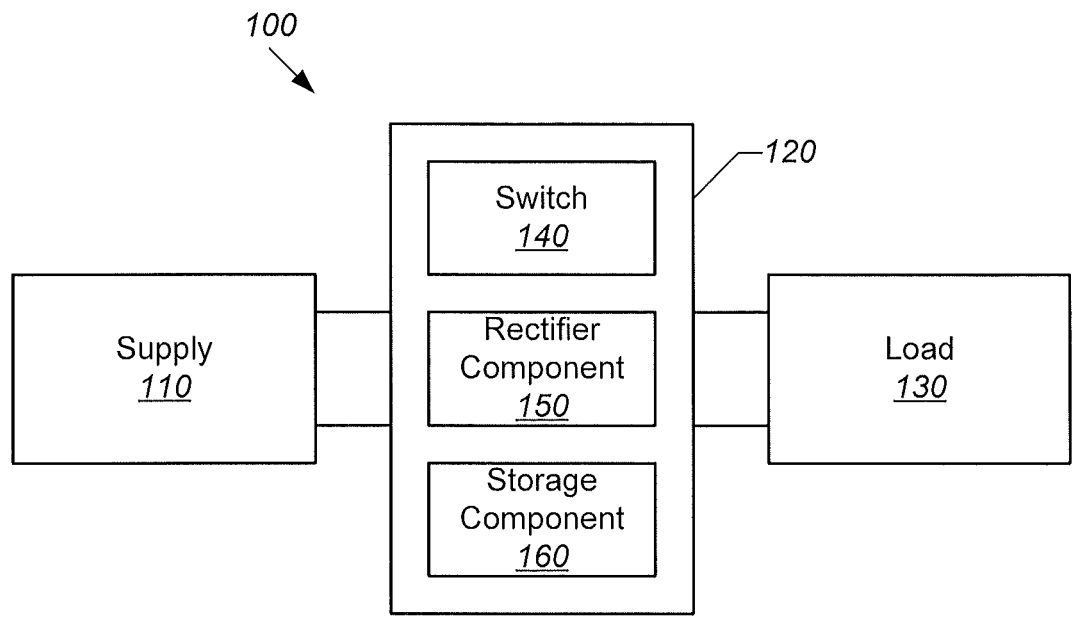
FIG. 1 is a block diagram of a power converter circuit that includes GaN High Electron Mobility Transistors (HEMTs) for switching and rectification according to some embodiments of the present inventive subject matter.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Some embodiments of the invention may be described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

Some embodiments of the present inventive subject matter may arise from the realization that the operating frequency of relatively high voltage power converter circuits may be increased through the use of High Electron Mobility Transistors (HEMTs), which are also known as modulation doped field effect transistors (MODFETs), to provide switching and/or rectification functionality. In some embodiments, the HEMTs may be embodied as GaN devices.

In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped ("unintentionally doped") smaller bandgap material, and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and relatively high carrier mobility can give the HEMT a relatively large transconductance, and may provide a performance advantage over metal-semiconductor field effect transistors (MESFETs) for high-frequency applications.

High electron mobility transistors fabricated in the gallium nitride/aluminum gallium nitride (GaN/AlGaN) material system can generate large amounts of Radio Frequency (RF) power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

HEMTs in the GaN/AlGaN system have already been demonstrated. For example, U.S. Pat. Nos. 5,192,987 and 5,296,395 describe AlGaN/GaN HEMT structures and methods of manufacture. In addition, U.S. Pat. No. 6,316,793, to Sheppard et al., which is commonly assigned and incorporated by reference herein, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure. Moreover, U.S. Patent Application Publication No. US2005/0170574 to Sheppard et al., which is also commonly assigned and incorporated by reference herein, describes a HEMT device including a protective layer and/or a low damage recess fabrication technique which may reduce damage to the semiconductor in the gate region of the transistor that may occur during an anneal of ohmic contacts of the device.

Referring now to FIG. 1, a power converter circuit 100, according to some embodiments of the present inventive subject matter, comprises a power supply 110, a converter circuit 120, and a load 130, which are connected as shown. The power supply 110 may be an Alternating Current (AC) or a Direct Current (DC) power supply. As shown in FIG. 1, the converter circuit 120 comprises a switch 140, a rectifier component 150, and a storage component 160. The load 130 may be any apparatus or device that receives the output voltage/current generated by the converter circuit 120 responsive to an input voltage/current received from the power supply 110. According to some embodiments of the present inventive subject matter, the switch 140 comprises at least one HEMT and the rectifier component 150 comprises at least one HEMT. In some embodiments, the HEMTs used in the switch 140 and rectifier component 150 may be GaN devices. Each of the HEMTs may comprise at least one heterojunction as a conducting channel. In accordance with various embodiments of the present inventive subject matter, the storage component 160 may comprise a magnetic field storage component and/or an electric field storage component. In some embodiments, the magnetic field storage component comprises an inductor and/or transformer. In further embodiments, the electric field storage component comprises a capacitor.

Operations of the power converter circuit 100, according to some embodiments of the present inventive subject matter, will now be described. The switch 140 may be configured in at least two operational states, such as an open or closed state, on or off state, etc. The rectifier component 150 may be biased in at least two operational states, such as forward or reverse biased. When the switch 140 is in a first operational state, the rectifier component 150 is in a first bias state and energy from the power supply 110 is stored in the storage component 160. When the switch 140 transitions to the second operational state, the rectifier component 150 is in a second bias state and the energy stored in the storage component 160 is released to the load 130. The voltage/current delivered to the load 130 may be regulated based on the duty cycle of the switch 140, which is a fraction of time that the switch 140 is in one of its operational states.

The converter circuit 120 may, in some embodiments, comprise a DC to DC power converter circuit and may be configured to operate, for example, in a hard switched mode or a resonant switched mode. In hard switched mode, the switch 140 switches between operational states at relatively high voltages and/or currents. In contrast, the switch 140 may be configured to operate in a resonant switched mode through use of an inductance-capacitance (LC) circuit that shapes the voltage/current applied to the switch so that the switch transitions between operational states when the voltage and/or the current is near zero. The DC to DC power converter circuit may be configured in, for example but not limited to, a Buck configuration, a Boost configuration, a Buck-Boost configuration, a Cuk configuration, a Single Ended Primary Inductor Converter (SEPIC) configuration, or a Zeta configuration.

Figure 2:
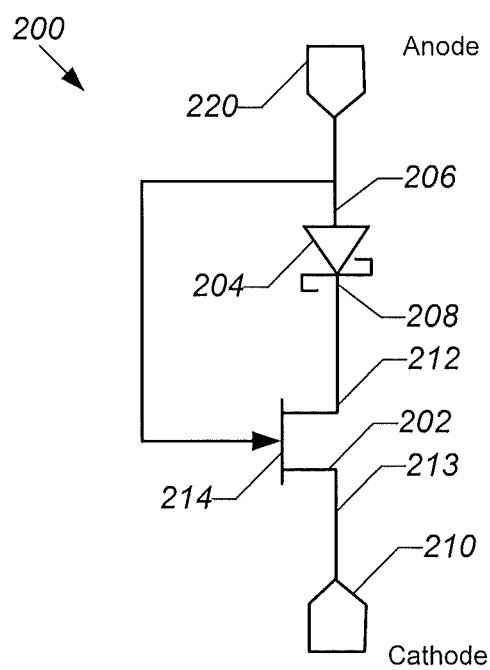
FIG. 2 is a circuit schematic of a rectifier component for use in power converter circuits according to some embodiments of the present inventive subject matter.

FIG. 2 is a circuit schematic that illustrates the rectifier component 150 according to some embodiments of the present inventive subject matter. The rectifier circuit 200 comprises a rectifier anode 220 and a rectifier cathode 210, between which current may be allowed to flow in a first direction with relatively low forward voltage drop characteristics and substantially prevented from flowing in a second direction. The rectifier circuit 200 comprises a depletion mode semiconductor 202 having an output connected to the cathode 210, which may be described as the rectified signal output node of the rectifier circuit.

In some embodiments, the depletion mode semiconductor 202 may comprise a HEMT device. The depletion mode semiconductor 202 may comprise any bidirectional conducting and forward blocking depletion mode device, such as, for example, a JFET using any semiconductor device, a GaN HEMT, a MESFET, a SiC MESFET, and/or MOSFET in any semiconductor device, among others. The HEMT 202 may comprise at least one heterojunction as a conducting channel. In some embodiments, the depletion mode semiconductor 202 may include GaN, AlGaAs, and/or GaAs, among other materials. The depletion mode semiconductor 202 may comprise a source node 112, a gate node 114, and/or a drain node 113.

The rectifier circuit 200 may comprise a hot carrier semiconductor diode 204 that includes a cathode 208 and an anode 206. In some embodiments, a hot carrier diode may be characterized by a low forward voltage drop and a very fast switching action and may be referred to as a majority carrier semiconductor. The cathode 208 may be connected to a source node 212 of the depletion mode semiconductor 202 and the anode 206 may be connected to a gate node 214 of the depletion mode semiconductor 202. In some embodiments, the node defined by the connection between the gate node 214 of the depletion mode semiconductor 202 and the anode 206 of the hot carrier semiconductor diode 204 may be connected to the rectifier anode 220.

In some embodiments, the hot carrier semiconductor diode 204 may comprise a Schottky diode. The hot carrier semiconductor 204 may comprise any low voltage, majority carrier high speed diode with low forward voltage drop. For example, the hot carrier semiconductor 204 may comprise a Schottky, junction barrier Schottky (JBS) etc. in any semiconductor, such as, for example, Si, SiC, GaN, GaAs, etc. In some embodiments, the hot carrier semiconductor diode 104 comprises a silicon Schottky diode. Thus, the rectifier circuit 200 may comprise a HEMT and a silicon Schottky diode used in combination with one another according to some embodiments of the present inventive subject matter. The HEMT used in the rectifier circuit may be embodied as a GaN device. In this manner, a high-voltage high-speed rectifier with low forward voltage drop may be realized via a combination including a high-voltage high-speed normally-on field effect transistor and a low-voltage high-speed diode. A rectifier circuit 200 as described herein may be referred to as a cascode rectifier.

In some embodiments, the hot carrier semiconductor diode 204 and the depletion mode transistor 202, as discussed above, may be integrated into a single device to form an on-chip device.

Operations of the rectifier circuit 200, according to some embodiments of the present inventive subject matter, will now be described. The forward bias case where current flows from anode to cathode will be described first. In some embodiments, this may correspond to a first half cycle of an AC input signal being applied to the rectifier anode 220. As the voltage is greater on the anode 206 than the cathode 208, the hot carrier semiconductor diode 204 is forward biased and thus conductive with a small voltage drop. The conducted voltage (minus the small voltage drop) of the hot carrier semiconductor diode 204 is applied to the source node 212 of the depletion mode semiconductor 202. As the AC input signal is also applied to the gate node 214 of the depletion mode semiconductor 202, a slight forward bias of the depletion mode semiconductor 202 gate to source junction is realized.

As a result of the forward bias of the depletion mode semiconductor gate to source junction, the depletion mode semiconductor 202 becomes conductive from the source node 212 to the drain node 213. The resulting rectifier anode 220 to rectifier cathode 210 voltage drop may be the hot carrier semiconductor diode 204 voltage drop plus the voltage drop due to the source node 212 to drain node 213 resistance of the depletion mode semiconductor 202.

The reverse bias case where current flows from the rectifier cathode 210 to the rectifier anode 220 will now be described. In some embodiments, this may correspond to a second half cycle of an AC input signal being applied to the rectifier anode 220. Under static conditions, the hot carrier semiconductor diode 204 may be in a blocking or non-conducting state. In this regard, the voltage at the source node 212 of the depletion mode semiconductor 202 may be floating. When the gate to source voltage drops below a threshold voltage, the depletion mode semiconductor 202 may be in a blocking and/or non-conducting mode as a result of the gate to source junction of the depletion mode semiconductor becoming reverse biased.

When the depletion mode semiconductor 202 is in a non-conducting mode, the rectifier circuit 200 ceases to conduct. In some embodiments, the reverse voltage across the hot carrier semiconductor diode 204 may be limited to the threshold voltage of the depletion mode semiconductor 202. The resulting rectifier circuit 200 may, thus, possess the high voltage and low capacitance characteristics of a high-voltage depletion mode semiconductor 202 with the switching characteristics of a low-voltage high-speed hot carrier semiconductor diode 204. In some embodiments, the hot carrier semiconductor diode 204 need only sustain the threshold voltage of the depletion mode semiconductor. In this manner, the high speed characteristics of the depletion mode semiconductor 202 may be exploited to form a diode with low forward drop without having to resort to synchronous rectification.

The depletion mode semiconductor 202 may comprise a field effect transistor (FET). For example, according to some embodiments of the present inventive subject matter, a high-voltage, low-capacitance rectifier circuit may be provided that includes a high-speed, high-voltage, normally-on FET 202 connected to a rectified signal output node of the rectifier circuit and a high-speed, low-voltage diode 204 having a cathode 208 connected to a source node 212 of the FET 202 and an anode 206 connected to a gate node 214 of the FET 202. In some embodiments, the diode 204 may be a Schottky diode. In other embodiments, the diode 204 may be a silicon Schottky diode. In some embodiments, the FET 202 comprises a HEMT circuit that incorporates at least one heterojunction as a conducting channel. The FET 202 may comprise a HEMT according to some embodiments of the present inventive subject matter. The HEMT used in the FET 202 may be embodied as a GaN device.

U.S. patent application Ser. No. 12/506,610, to Callanan et al., which is commonly assigned and incorporated by reference herein, describes exemplary embodiments of the rectifier circuit 200 of FIG. 2 in greater detail.

Figures 3, 4:
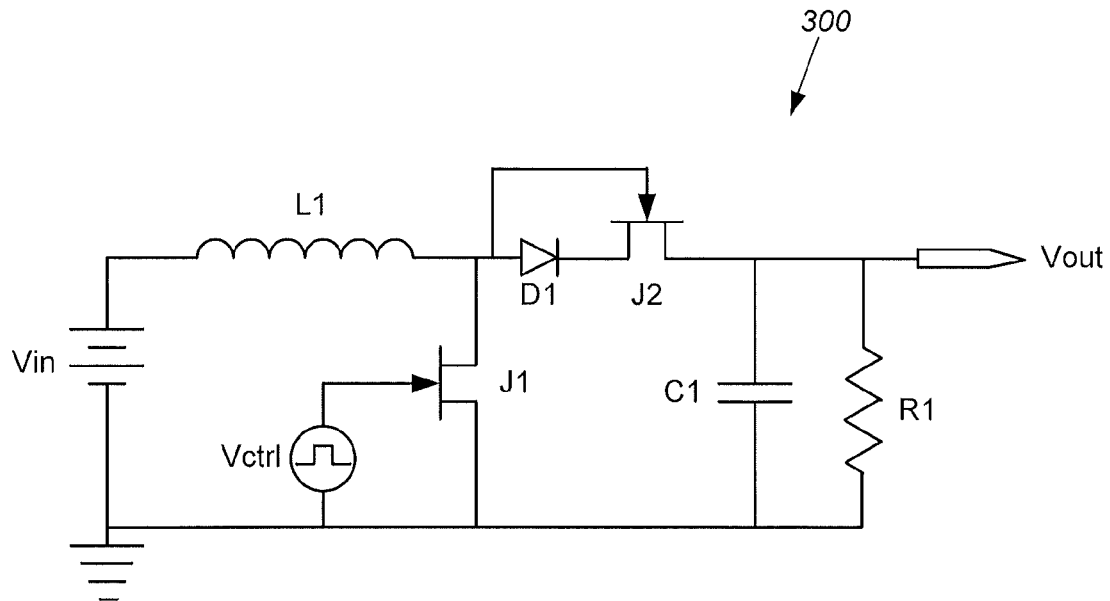
FIG. 3 is a circuit schematic of a boost Direct Current to Direct Current (DC to DC) power converter circuit according to some embodiments of the present inventive subject matter.
FIG. 4 is a table of simulation results for the boost power converter circuit of FIG. 3.

FIG. 3 is a circuit schematic of a boost DC to DC power converter circuit 300 according to some embodiments of the present inventive subject matter. The boost power converter circuit 300 comprises a power supply voltage Vin, which is coupled to a load represented as capacitor C1 and resistor R1 by a voltage converter circuit. The voltage converter circuit comprises a storage component, which is represented by the inductor L1, a rectifier component, which is represented by the diode D2 and the FET transistor J2, and a switch, which is represented by the FET transistor J1. A control signal Vctrl is used to regulate the duty cycle of the transistor J1. The diode D2 and transistor J2 may be embodied as described above with respect to the rectifier circuit 200 of FIG. 2. Both transistors J1 and J2 may be HEMTs. In some embodiments, the transistors J1 and J2 may be GaN HEMTs.

Exemplary operations of the boost DC to DC power converter circuit 300 will now be described. When the switching transistor J1 is turned on, current through the inductor L1 increases. When the switching transistor J1 is turned off, the current flowing through the inductor L1 can no longer flow through the transistor J1 and flows instead through the diode D1 and transistor J2 to charge the capacitor C1. Thus, energy accumulated in the inductor L1 while the transistor J1 is in an on state is transferred to the load when the transistor J2 transitions to the off state.

The boost DC to DC power converter circuit 300 of FIG. 3 with both transistors J1 and J2 being GaN HEMTs was simulated using PSPICE. The parameters used during the simulation are shown in FIG. 4. The results show that the use of GaN HEMTs to provide a switching and rectification function in the boost DC to DC power converter circuit 300 may allow operation at very high frequencies (e.g., >20 MHz) and high power (e.g., >100 W) with relatively high efficiency. The unique combination of high voltage and high frequency capability, due, for example, to the low capacitance of the switching and rectification components, may allow the passive parts volume in such a power converter circuit to be reduced by two orders of magnitude. Thus, according to some embodiments of the present inventive subject matter, a power converter circuit may be provided using relatively low capacitance switching and rectification components that can operate at relatively high voltages up to approximately 600 V. Moreover, the low capacitance of the switching and rectification components may allow the power converter circuit to operate at frequencies in a range of approximately 10 MHz to 100 MHz in a resonance switched operational mode and 1 MHz to 10 MHz in a hard switched operational mode while maintaining an efficiency of at least 95%.

In the drawings and specification, there have been disclosed typical embodiments of the inventive subject matter, and, although specific terms are used, they are used in a generic and descriptive sense only and not for purposes of limitation, the scope of the invention being set forth in the following claims.

That which is claimed:

1. A power converter circuit, comprising:
a storage component;
a rectifier component connected to the storage component comprising a first field effect transistor and having first and second bias states and a SiC semiconductor diode having a cathode connected to a source node of the first field effect transistor and an anode connected to a gate node of the first field effect transistor; and
a switch connected to the storage component and the rectifier component comprising a second field effect transistor having first and second operational states;
wherein the first and second field effect transistors comprise first and second high electron mobility transistors (HEMTs), respectively; and
wherein the power converter has a switching frequency in a range of about 10 MHz-100 MHz when operating in a resonance switched operational mode and in a range of about 1 MHz-10 MHz when operating in a hard switched operational mode.

2. The power converter circuit of claim 1, wherein energy from a power source is stored in the storage component when the switch is configured in the first operational state and the rectifier component is in the first bias state and the stored energy in the storage component is released to a load when the switch is configured in the second operational state and the rectifier component is in the second bias state.

3. The power converter circuit of claim 1, wherein the semiconductor diode comprises a Schottky diode.

4. The power converter circuit of claim 1, wherein the first HEMT comprises at least one heterojunction as a conducting channel.

5. The power converter circuit of claim 1, wherein the second HEMT comprises at least one heterojunction as a conducting channel.

6. The power converter circuit of claim 1, wherein the power converter circuit is a Direct Current to Direct Current (DC to DC) power converter circuit and the switch is operable in the hard switched mode.

7. The power converter circuit of claim 1, wherein the power converter circuit is a Direct Current to Direct Current (DC to DC) power converter and the switch is operable in the resonant switched mode.

8. The power converter circuit of claim 1, wherein the power converter circuit is a Direct Current to Direct Current (DC to DC) power converter circuit and the storage component, the rectifier, and the switch are configured in a Buck configuration, a Boost configuration, a Buck-Boost configuration, a Cuk configuration, a Single Ended Primary Inductor Converter (SEPIC) configuration, or a Zeta configuration.

9. The power converter circuit of claim 1, wherein the storage component comprises a magnetic field storage component.

10. The power converter circuit of claim 9, wherein the magnetic field storage component comprises an inductor and/or a transformer.

11. The power converter circuit of claim 1, wherein the storage component comprises an electric field storage component.

12. The power converter circuit of claim 11, wherein the electric field storage component comprises a capacitor.

13. The power converter circuit of claim 1, wherein the first and second HEMTs comprise first and second GaN HEMTs.

* * * * *